(12) United States Patent
Obeng et al.

(10) Patent No.: US 7,670,952 B2
(45) Date of Patent: Mar. 2, 2010

(54) METHOD OF MANUFACTURING METAL SILICIDE CONTACTS

(75) Inventors: Yaw S. Obeng, Frisco, TX (US);
Juanita DeLoach, Plano, TX (US);
Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 11/690,643

(22) Filed: Mar. 23, 2007

(65) Prior Publication Data
US 2008/0230846 A1 Sep. 25, 2008

(51) Int. Cl.
*H01L 21/311* (2006.01)
(52) U.S. Cl. .................. 438/695; 438/696; 438/690; 438/759; 257/E21.226; 257/E21.249; 257/E21.306; 257/E21.313
(58) Field of Classification Search .................. 438/233, 438/592, 655, 656, 664, 669, 683, 694, 695, 438/696, 690, 906, 759; 257/E21.621, E21.622, 257/E21.224, E21.226, E21.249, E21.305, 257/E21.306, E21.307, E21.313; 216/67
See application file for complete search history.

(56) References Cited

U.S. PATENT DOCUMENTS

| 5,960,270 | A | 9/1999 | Misra et al. |
| 7,416,989 | B1 | 8/2008 | Liu et al. |
| 2005/0218114 | A1 | 10/2005 | Yue et al. |
| 2005/0230350 | A1* | 10/2005 | Kao et al. ............... 216/67 |
| 2005/0272235 | A1* | 12/2005 | Wu et al. .............. 438/592 |
| 2007/0015360 | A1 | 1/2007 | Lu et al. |
| 2007/0138564 | A1* | 6/2007 | Lim et al. ............. 257/369 |
| 2007/0228458 | A1* | 10/2007 | Henson et al. ............. 257/327 |

FOREIGN PATENT DOCUMENTS

WO WO/2007/011568 1/2007

OTHER PUBLICATIONS

Ghandhi, VLSI Fabrication Principles, Silicon and Gallium Arsenide, 1983 by John Wiley & Sons Inc, pp. 517-519.*

* cited by examiner

*Primary Examiner*—Julio J Maldonado
(74) *Attorney, Agent, or Firm*—Warren L. Franz; Wade J. Brady, III; Frederick J. Telecky, Jr.

(57) ABSTRACT

A method of manufacturing a semiconductor device, comprising forming a metal silicide gate electrode on a semiconductor substrate surface. The method also comprises exposing the metal silicide gate electrode and the substrate surface to a cleaning process. The cleaning process includes a dry plasma etch using an anhydrous fluoride-containing feed gas and a thermal sublimation configured to leave the metal silicide gate electrode substantially unaltered. The method also comprises depositing a metal layer on source and drain regions of the substrate surface and annealing the metal layer and the source and drain regions of the substrate surface to form metal silicide source and drain contacts.

6 Claims, 4 Drawing Sheets

METHOD OF MANUFACTURING METAL SILICIDE CONTACTS

TECHNICAL FIELD

The disclosure is directed, in general, to a method of manufacturing a semiconductor device, and more specifically, to a semiconductor having metalized gate and source drain electrodes, and to semiconductor devices manufactured therefrom.

BACKGROUND

As semiconductor device feature sizes continue to shrink, the charge carrier depletion of gate electrodes made of polysilicon becomes a serious issue. One approach to resolving this issue is to replace polysilicon gate electrodes with a metalized (e.g., metal silicide) gate electrode. Integrating metal silicide gate electrodes into semiconductor device fabrication can be problematic, however. For instance, the steps to form a metal silicide gate electrode can inadvertently cause excessive silicidation of metal silicide source and drain contacts. Consequently, the metallization of source and drain contacts and, the metallization of the gate electrode, are often done at separate stages in the device fabrication process. Typically, the gate electrode is metalized first, and the source and drain regions are metalized later in the process. The already-metal silicided gate electrode can be damaged, however, when performing certain conventional processes to form the metal silicide source and drain contacts.

Accordingly, what is needed is a method for manufacturing semiconductor devices having metal silicide gate and source drain electrodes that addresses the drawbacks of the prior art methods and devices.

SUMMARY

The disclosure provides a method for manufacturing a semiconductor device. A metal silicide gate electrode is formed on a semiconductor substrate surface. The metal silicide gate electrode and the substrate surface are exposed to a cleaning process. The cleaning process includes a dry plasma etch using an anhydrous fluoride-containing feed gas. The cleaning process also includes a thermal sublimation that is configured to leave the metal silicide gate electrode substantially unaltered. The method further comprises depositing a metal layer on source and drain regions of the substrate surface and annealing the metal layer and the source and drain regions of the substrate surface to form metal silicide source and drain contacts.

In another embodiment of the method, one or more transistors are formed on or in a semiconductor substrate. At least one of the transistors is manufactured by a process that includes forming a nickel silicide gate electrode on a semiconductor substrate surface and exposing the nickel silicide gate electrode and the substrate surface to the above-described cleaning process. The dry plasma etch includes anhydrous hydrogen fluoride or ammonium fluoride-containing feed gases. The thermal sublimation includes heating the semiconductor substrate to a temperature ranging from about 100 to 180° C. The manufacture of the transistor further comprises depositing a nickel layer on source and drain regions of the substrate surface, and annealing the nickel layer and the source and drain regions of the substrate surface to form nickel silicide source and drain contacts.

The disclosure also provides the semiconductor devices resulting from the method of manufacture. One embodiment is an integrated circuit comprising a transistor on or in a semiconductor substrate. The transistor includes a metal silicide gate electrode on the semiconductor substrate surface and source and drain regions in the semiconductor substrate that are adjacent to the metal silicide gate electrode. The transistor further includes metal silicide source and drain contacts on the source and drain regions. The source and drain regions of the semiconductor substrate surface are subjected to the above-described cleaning process prior to forming the metal silicide source and drain contacts. The integrated circuit further comprises metal contacts in a pre-metal dielectric layer located over the transistor. The metal contacts are located on the metal silicide gate electrode and the metal silicide source and drain contacts. The integrated circuit also comprises interconnects in inter-layer dielectric layers located over the pre-metal dielectric layer. The interconnects contact the metal silicide gate electrode and said metal silicide source and drain contacts through the metal contacts.

BRIEF DESCRIPTION OF DRAWINGS

The disclosure is described with reference to example embodiments and to accompanying drawings, wherein.

DETAILED DESCRIPTION

As part of forming the metal silicide source and drain contacts, a metal layer is deposited on regions of a semiconductor substrate that correspond to the source and drain structures, and the metal layer and substrate portions are then reacted together to form a metal silicide. Any unreacted metal is then removed via a stripping process. It was discovered that the metal layer was delaminated from the source and drain regions during prolonged exposure (e.g., about 5 minutes or greater) to the metal-removing agents, with substantially no metal silicide being formed. It was further discovered that a wet-clean process done prior to depositing the metal layer was leaving a substantial amount of oxide on the source and drain regions.

It was also discovered that oxides remaining on the source and drain regions interfered with the formation of the metal silicide source and drain contacts. Replacing the pre-metal-deposition wet-clean process with the cleaning process disclosed herein facilitated the formation of the metal silicide source and drain contacts. Importantly, the cleaning process disclosed herein was configured to prevent the already-metal silicided gate electrode from being substantially altered. Consequently, both the metal silicided gate electrode and source and drain regions could be directly exposed to the cleaning process without the need for additional process steps to mask the metal silicided gate electrode.

Figure 1:
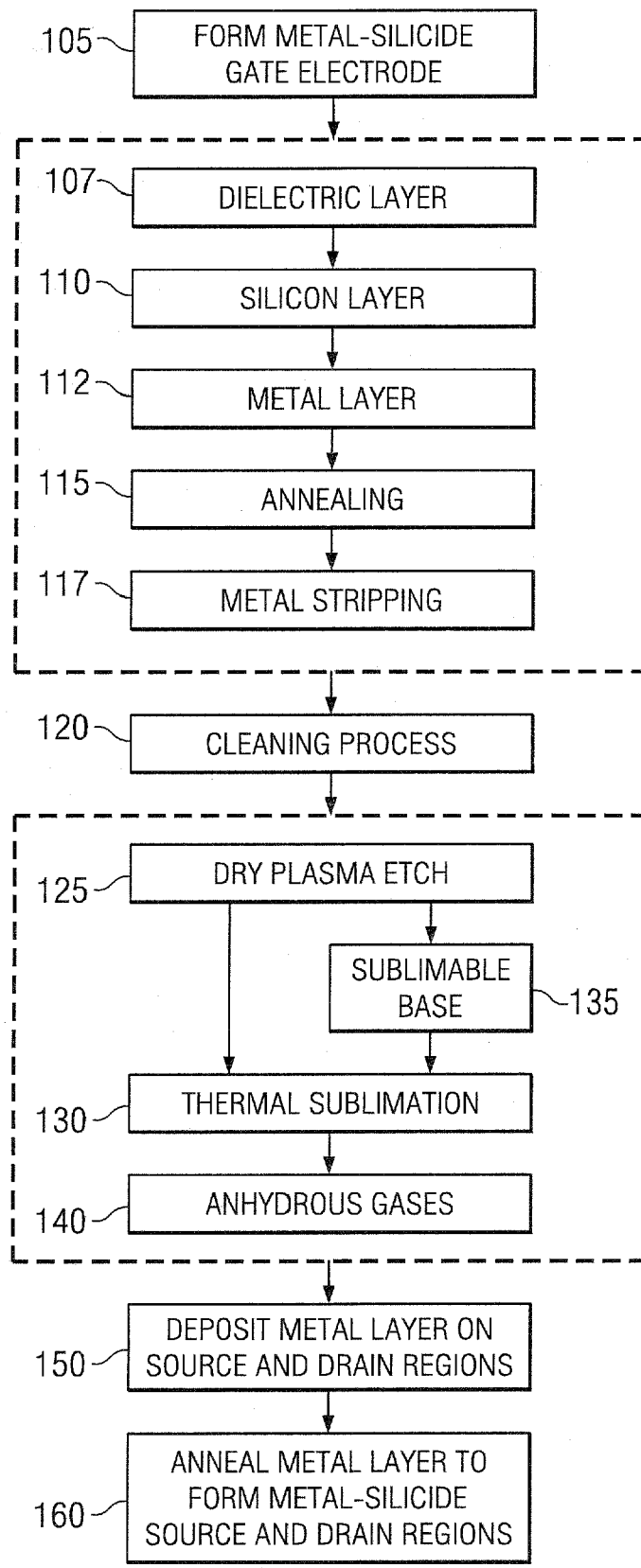
FIG. 1 presents a flow diagram of an example method of manufacturing a semiconductor device that includes the cleaning processes of the present disclosure.

One embodiment of the disclosure is a method of manufacturing a semiconductor device. FIG. 1 presents a flow diagram of an example method of manufacturing a semiconductor device that includes the cleaning processes of the present disclosure As shown in FIG. 1, the method includes forming a metal silicide gate electrode on a semiconductor substrate surface (step 105). Forming the metal silicide gate electrode 105 can include a step 107 of depositing a dielectric layer on the semiconductor surface, and a step 110 of depositing a silicon-containing electrode layer (e.g., polysilicon layer) on the dielectric layer. Chemical vapor deposition (CVD), physical layer deposition (PVD), atomic layer deposition (ALD), or other conventional methods can be used to deposit the dielectric layer (e.g., silicon oxide) and silicon-containing layer (e.g., polysilicon) on the substrate surface.

Forming the metal silicide gate electrode 105 can also include a step 112 of depositing a metal layer on the silicon-containing electrode layer, and a step 115 of annealing the metal layer and the silicon-containing electrode layer to form a metal silicide alloy. The metal layer metal can include a refractory metal such as nickel, platinum or alloys of refractory metals and other metals (e.g., NiPt), deposited by a PVD process. In some embodiments, where the metal layer comprises nickel, the annealing step 115 includes one or more stages of heating to temperatures ranging from about 300° C. to 500° C. for durations of about 60 to 120 seconds.

Forming the metal suicide gate electrode 105 can also include a stripping process 117 to remove any of the metal layer that did not react with the silicon-containing layer during the annealing step 115. The stripping process 117 can include a wet strip process that includes aqueous acids as metal-removing agents (e.g., $H_2SO_4$, $H_2O_2$, HCl, $HNO_3$ or mixtures thereof) followed by a water rinse. It is thought that oxides and organic matter can remain on the substrate's surface following the stripping process 117 or other subsequent processing steps, e.g., to facilitate the implantation of dopants into the substrate.

The method further includes exposing the metal silicide gate electrode and the substrate surface to a cleaning process (step 120). In particular, the source and drain regions of the substrate are exposed to the cleaning process 120. The cleaning process 120 includes at least two steps: a dry plasma etch using an anhydrous fluoride-containing feed gas (step 125) and a thermal sublimation configured to leave the metal silicide gate electrode substantially unaltered (step 130). In some embodiments, the cleaning process 120 consists essentially of the dry plasma etch 125 and the thermal sublimation 130. That is, in such embodiments, there are no additional steps required, or desired, to clean the substrate surface prior to metal layer deposition. For instance, there is no wet-clean process, including a high temperature standard clean using $NH_4OH$, $H_2O_2$ or similar organic matter removing agents. There is also no wet-clean process that includes an aqueous hydrofluoric wet etch. There is also no water rinse after the high temperature standard clean or the HF wet etch.

The term anhydrous fluoride-containing feed gas as used herein refers to a feed gas having less than about 0.1 wt % water content. The term thermal sublimation as used herein refers to a temperature and duration that is sufficient to cause reaction products of the dry plasma etch of step 125 to be sublimed from the surface of the source and drain regions of the substrate. E.g., it is believed that the dry plasma etch 125 applied to a silicon substrate results in the formation of $SiF_6^{2-}$ salts as a reaction product, which in turn, can be sublimed under conditions that do not substantially alter the metal silicided gate electrode.

The term substantially unaltered metal silicide gate electrode as used herein refers to a metal silicide whose phase or crystal structure has not changed, and that has not been significantly decomposed. The phase or crystal structure of the metal silicide gate electrode is considered not to have changed if its metal:silicon stoichiometry is changed by less than 10 percent, and if the vertical thickness of the metal silicide gate electrode is changed by less than about 10 percent. E.g., consider when the metal silicide gate electrode is composed of $Ni_2Si$ and gate electrode has a vertical thickness of about 100 nm. If the Ni:Si ratio of 2:1 changes by less than 10 percent, and the vertical thickness changes by less than 10 percent, (before versus after the cleaning process) then the phase or crystal structure of the metal silicide has not changed. The metal silicide gate electrode is also considered not to have not been significantly decomposed (e.g., due to corrosion from the dry plasma etch) if the vertical thickness of the metal silicide gate electrode decreases by less than about 10 percent (before versus after the cleaning process).

Some embodiments, of the dry plasma etch step 125 includes a feed gas of hydrogen fluoride, ammonium fluoride, nitrogen trifluoride or mixtures thereof In some cases, the feed gas further includes a carrier gas comprising an inert species such as helium. In some cases the feed gas further includes introducing one or more sublimable bases into the feed gases (step 135). The sublimable base facilitates the removal of oxides or organic species from the substrate surface. A sublimable base is defined as an anion that is capable of being complexed with the at least one of reaction product of the dry plasma etch 125, and then sublimed from the substrate surface at or below the temperature used in the thermal sublimation step 130. Example sublimable bases include ammonia, pyridine or mixtures thereof. E.g., when the reaction product includes $SiF_6^{2-}$, the sublimable base can form ion complexes of $(NH_4)_2 SiF_6$, which is then sublimable at a lower temperature than $H_2 SiF_6$. Similar complexes can be formed with pyridine, or with other sublimable bases, such as Lewis bases. The ability to use a lower temperature to sublime the reaction product helps to reduce the chances of altering the metal silicide gate electrode.

In some embodiments, the dry plasma etch step 125 includes an RF plasma generated using an $NF_3:NH_3:He$ sccm ratio ranging from about 12:65:270 to about 16:75:330 as feed gases. The plasma can be generated using an RF power of about 27 to 33 Watts, and chamber pressure of about 2 to 4 Torr. The duration of the step 125 can range from about 7 to 15 seconds. In some cases, durations of 20 seconds or longer undesirably cause excess erosion of other oxide structures of the device. For example, a duration of 22 seconds under the above conditions can cause silicon oxide isolation structures of the device (e.g., field oxides or shallow trench isolation structures) to erode in thickness by about 5 percent.

The conditions of the thermal sublimation step 130 are carefully selected to provide a balance of rapid and total sublimation of the oxides from the substrate surface versus avoiding any substantial alterations to the metal silicided gate electrode. The conditions of the thermal sublimation depend upon the composition of the metal silicided gate electrode. In some embodiments, e.g., such as when the metal silicide of the gate electrode is a nickel silicide (e.g., $NiSi_2$), the thermal sublimation step 130 includes heating the semiconductor substrate to a temperature ranging from about 100 to 180° C. Temperatures higher that this are avoided because the phase or crystal structure of some nickel silicides can be altered at higher temperatures.

In some embodiments the thermal sublimation step 130 also includes a flow of an anhydrous atmosphere (step 140). E.g., $H_2:Ar$ in seem ratios of 1000:1000 at a pressure of less than about 760 Torr. The flow of gases such as $H_2$ or Ar facilitates the sublimation being caffied out under anhydrous conditions. E.g., $H_2$, Ar, or both gases, are flowed through the sublimation chamber to prevent exposing the substrate surface to water vapor. In some embodiments a duration of the thermal sublimation step 130 ranges from about 30 to 90 seconds.

Numerous other steps can be included to complete the manufacture of the semiconductor device. E.g., the method can further include depositing a metal layer on the source and drain regions of the substrate surface (step 150). Preferably, the metal layer is deposited soon after the cleaning process 120 (e.g., within about 120 minutes), such that no additional oxide can form on the substrate, and the metal layer is in direct contact with the substrate surface that was just cleaned. The metal layer deposited in step 150 can be composed of the same metal as the metal deposited in step 112 as part of forming the metal silicide gate electrode. E.g., in some cases, both of these metal layers comprise, and in some cases consist essentially of, the same refractory metal (e.g., Ni). In other cases, the metal layer deposited in step 150 comprises Ni and Pt in ratios ranging from about 100:0.5 to 100:20, and in other cases about 95:5. The inclusion of the Pt in the metal layer advantageously improves the thermostability of the metal suicide and minimizes the agglomeration of the metal silicide at temperatures used in subsequent device fabrication steps. The metal layer deposited in step 150 can be deposited using the same or a different process as used to deposit the metal layer in step 112.

The method of manufacture can further include annealing the metal layer and the source and drain regions of the substrate surface to form metal silicide source and drain contacts (step 160). The duration and temperature of the thermal annealing step 160 is adjusted to promote interdiffusion of the atoms of the source and drain regions and atoms of the metal layer deposited on these regions. However, the duration and temperature of the thermal annealing step 160 is also configured to not substantially alter the metal suicide gate electrode. E.g., consider when the metal silicide gate electrode is composed substantially (e.g., at least 99%) of $Ni_2Si$ and the metal silicide source/drain contacts are composed substantially (e.g., at least 99%) of NiSi. In such cases thermal annealing comprises a temperature ranging from about 350 to 600° C. for a duration of about 0.1 to 1 minute.

To further illustrate aspects of the disclosure, FIGS. 2-7 show cross-section views, at various stages of manufacture, of an example semiconductor device 200 according to the principles of the present disclosure. In some cases the device 200 includes a transistor 202 and the method includes forming a metal silicide structures of the transistor 202.

Figure 2:
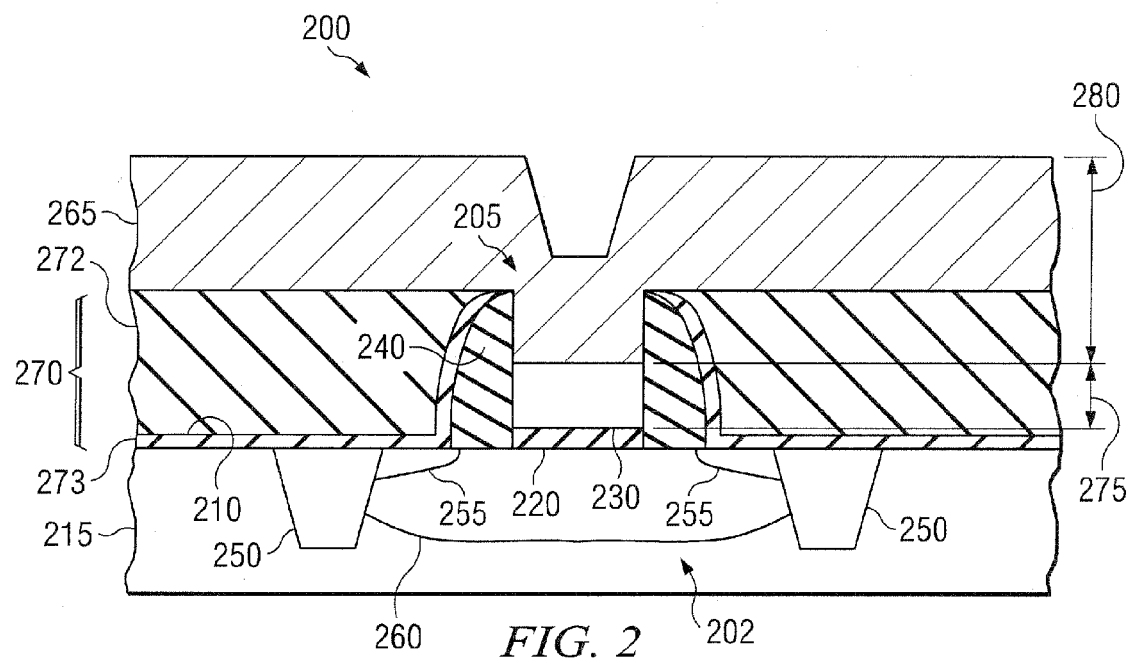
FIGS. 2-7 show cross-section views, at various stages of manufacture, of an example semiconductor device according to the principles of the present disclosure.
Figure 3:
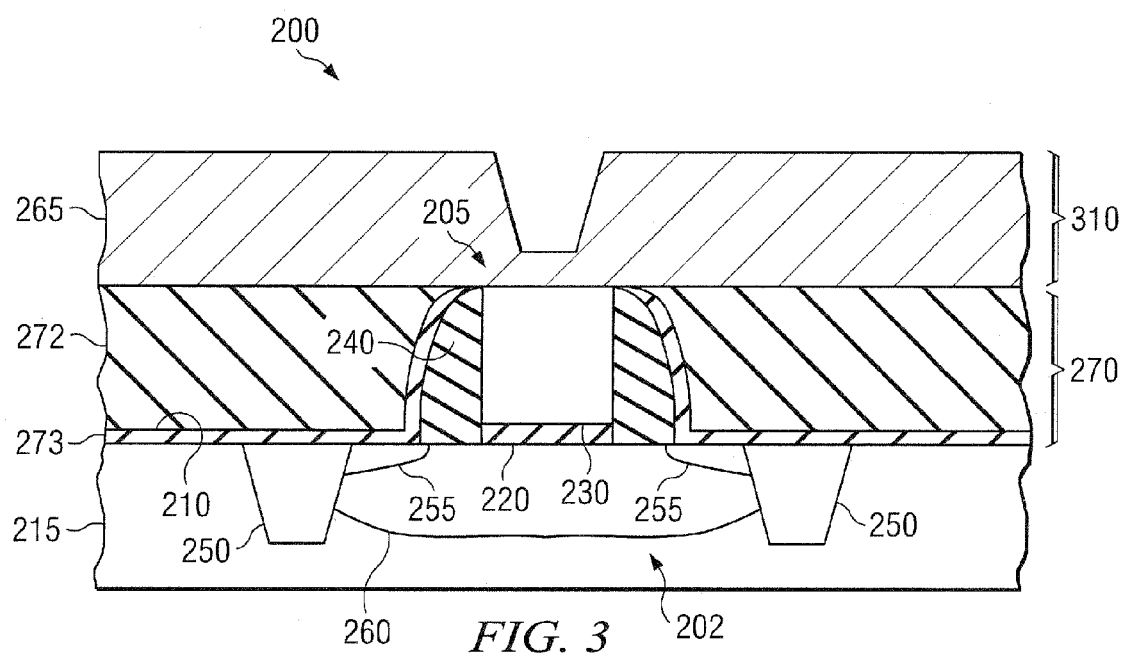

With continuing reference to FIG. 1, FIGS. 2-3 shows the device 200 while forming a metal silicide gate electrode 205 on a surface 210 of a semiconductor substrate 215 of the device 200, in accordance with step 105 (FIG. 1). FIG. 2 shows the device after depositing and patterning layers of insulating and silicon-containing material (e.g., polysilicon) to form a gate dielectric layer 220 and silicon-containing gate electrode layer 230, respectively, on the substrate 215 in accordance with steps 107 and 110.

Similar patterning and etching procedures can be followed to form insulating sidewalls 240, comprising, e.g., silicon nitride, silicon oxide or multilayered combinations thereof, on the gate dielectric 220 and the silicon-containing gate electrode 230. FIG. 2 also shows the device 200 after forming isolation structures 250 (e.g., shallow trench isolation or field oxide structure) in or on the semiconductor substrate 215. Forming isolation structures 250 can include a dry-etch, wet-etch, or a combination thereof, to form openings in the substrate 215, followed by depositing an insulator (e.g., silicon dioxide) in the openings. Alternatively, a thick (e.g., 200 nm) field oxide layer can be grown on the substrate surface 210, and then portions removed using a patterned etch to leave the isolation structures 250. FIG. 2 also shows the device after forming source and drain regions 255 in the substrate 215. E.g., dopants can be implanted into the substrate 215 followed by a rapid thermal anneal or laser annealing to diffuse the dopants into the substrate 215, thereby defining the source and drain regions 255. P-type dopants are implanted when the transistor 202 is a pMOS transistor; n-type dopants are implanted when the transistor 202 is an nMOS transistor. Dopants can also be implanted into the silicon-containing gate electrode 230 to adjust the work function of the electrode 230. The substrate 215 can comprise a silicon wafer or include a silicon layer that is epitaxially grown on a silicon-germanium substrate, or other types of semiconductive material such as indium phosphide or gallium arsenide. The substrate 215 can be implanted with n- or p-type dopants to form doped wells 260.

FIG. 2 further shows the device after depositing a metal layer 265 on the silicon-containing gate electrode 230 in accordance with step 112. To facilitate metal deposition, a sacrificial layer 270 can be deposited (e.g., using CVD) on the substrate 215, and then planarized (e.g., using chemical mechanical polishing), such that the silicon-containing gate electrode 230 is exposed. The sacrificial layer 270 can include an insulating layer 272 of silicon oxide (e.g., silicon dioxide, or tetraethyl orthosilicate, TEOS) and a nitride layer 273. The metal layer 265 is deposited on the silicon-containing gate electrode 230 and the planarized sacrificial layer 270.

As also shown in FIG. 2, in some cases, a portion of the silicon-containing gate electrode 230 is removed (e.g., using a reactive ion etch comprising HBr) before depositing the metal layer 265. E.g., the silicon-containing gate electrode 230 is reduced to have a smaller thickness than that of the sidewalls 240. In some embodiments, the thickness 275 of the silicon-containing gate electrode 230 ranges from about 50 to 150 nm.

The thickness 275 of the silicon-containing electrode 230, the thickness 280 of the metal layer 265, and the conditions of the annealing step 115 (e.g., temperature and duration), can be controlled to form the desired metal silicide gate electrode 205. E.g., the ratio of nickel layer thickness 280 to silicon-containing electrode layer thickness 275 can be adjusted from 1:1 to 3:1 to form a metal silicide gate electrode 205 having a Ni:Si ratio ranging from about 1:1 to 3:1, respectively. Thickness ratios of about 2:1 to 3:1 can be used to form $Ni_2Si$, $Ni_{31}Si_{12}$, or $Ni_3Si$ gate electrodes 205. Such metal silicide electrode compositions are conducive to provide the transistor 202 with a metal silicide gate electrode 205 of the appropriate work function (e.g., about 4.8 to 5.0 eV). In other embodiments, e.g., a thickness ratio of about 1:1 is used to form a NiSi gate electrode 205, thereby providing a gate electrode 205 with a lower range of work function (about 4.2 to 4.5 eV).

FIG. 3 shows the device 200 after annealing (step 115) the silicon-containing gate electrode 230 and metal layer 265 of FIG. 2 to form the metal silicide gate electrode 205. In some embodiments, such as shown in FIG. 3, the annealing step 115 is sufficient to fully interdiffuse the atoms of the silicon-containing electrode 230 and the metal layer 265 to form a homogenous fully metal silicided gate electrode 205. In some cases, as also illustrated in FIG. 3, not all of the metal layer 265 is silicided. E.g., a portion 310 of the metal layer 265, above the sacrificial layer 270 and above the metal silicide gate electrode 205 does not react with the silicon-containing electrode 230 (FIG. 2).

Figure 4:
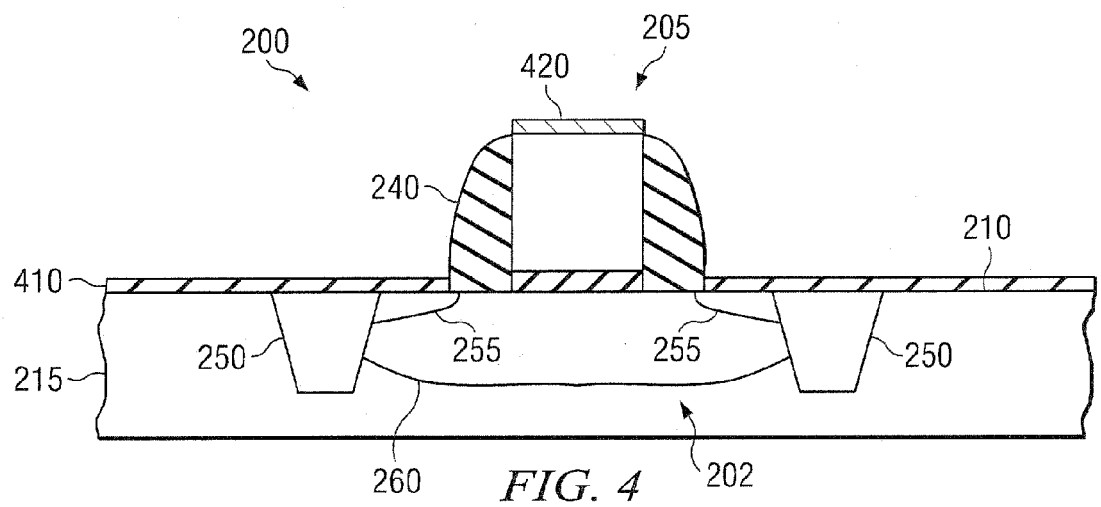

FIG. 4 shows the device 200 after subjecting the substrate 215 to a metal stripping process to remove the unreacted portions 310 (FIG. 3) of the metal layer 265 in accordance with step 117. FIG. 4 also shows the device after removing the sacrificial layer 270 of FIG. 2 (e.g., using a hydrofluoric acid and phosphoric acid wet strip). As illustrated in FIG. 4, after removing the metal layer 265 and sacrificial layer 270, an oxide layer 410 (e.g., a native silicon oxide) can spontaneously form on the substrate surface 210 as well as on the metal silicide gate electrode surface 420. The oxide layer 410 can further include organic material or residue resulting from the metal layer 265 and sacrificial layer 270 removal steps.

Figure 5:
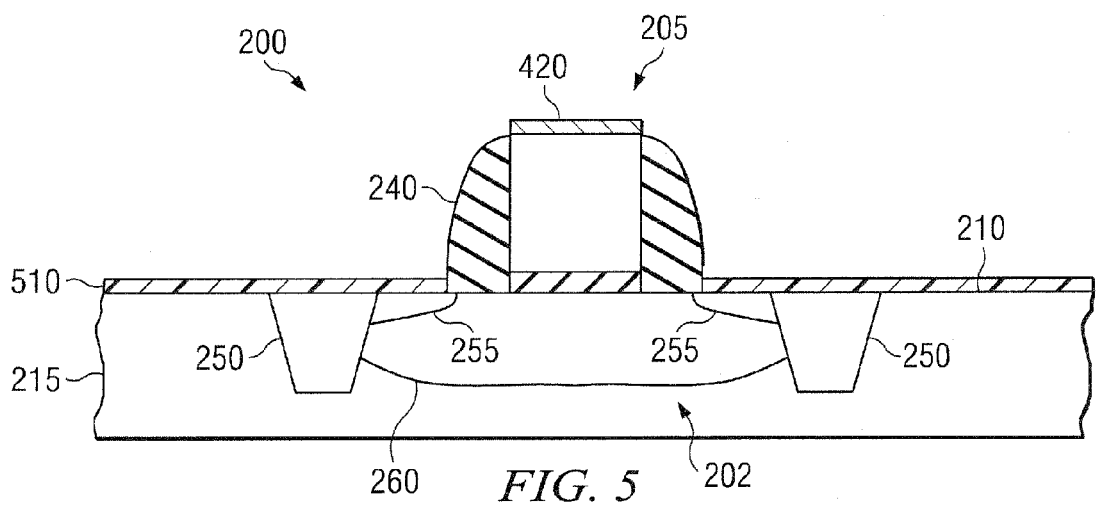

FIG. 5 shows the device 200 after exposing the metal silicide gate electrode 205 and the substrate surface 210 to a cleaning process, in accordance with step 120. It is important, and in some cases critical, to entirely remove the oxide layer 410 (FIG. 4) before forming metal silicide contacts on the source and drain regions 255. Additionally, it is important, and in some cases critical, to the proper functioning of the example device 200, that the metal silicide gate electrode 205 not be substantially altered by the cleaning process.

FIG. 5 shows the device 200 after exposing the metal suicide gate electrode 205 and the substrate surface 210 (including the source and drain regions 255) to a dry plasma etch (step 125) of the cleaning process. The dry plasma etch, which includes an anhydrous fluoride-containing feed gas, converts the layer 410 of oxide and other residue (FIG. 4) into reaction products 510. In some cases, the reaction products 510 are directly sublimable under the conditions of the thermal sublimation process (step 130). In other cases, the introduction of a sublimable base (step 135) results in the formation of an ion-complex that is sublimable. The sublimable base can be a Lewis base. In some cases, the feed gas of step 125 further includes a sublimable base consisting essentially of ammonia or pyridine.

Figure 6:
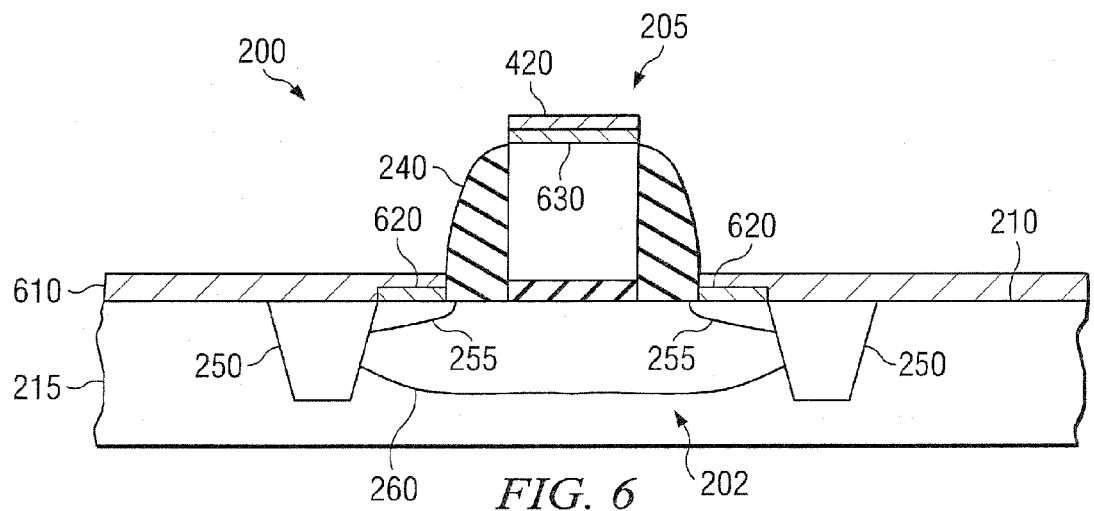

FIG. 6 shows the device 200 after performing the thermal sublimation step 130 of the cleaning process 120. Thermal sublimation can include heating the semiconductor substrate 215 to a temperature ranging from about 100 to 180° C., such as when the metal silicide gate electrode 205 is composed of nickel silicide. The thermal sublimation step 130 removes the reaction products 510 (FIG. 5), or ion-complex, produced by the dry plasma etch (step 125) from the source and drain regions 255, and other areas of the substrate surface 210.

FIG. 6 also shows the device 200 after depositing a metal layer 610 on the substrate 215, including on the cleaned source and drain regions 255, in accordance with step 150. Also shown is the device 200 after reacting the metal layer 610 with the source and drain regions 255 by performing an anneal in accordance with step 160 to form metal silicide contacts 620. E.g., in some cases a nickel layer 610 deposited on the source and drain regions 255 is annealed to form nickel silicide contacts 620. As illustrate, a nickel silicide contact 630 can also be formed on the metal silicide gate electrode 205.

In some cases the anneal (step 160) includes heating the substrate 215 to a temperature and for a duration substantially the same as that used in step 115. In other cases, heating to a lower temperature than used in step 115 helps ensure that the metal silicide gate electrode 205 is not altered by the annealing step 160. E.g., in some cases the annealing step 160 includes heating to about 400 to 600° C. for about 1 to 60 seconds.

The substantial freedom of the source and drain regions 255 from the oxide and residue layer 410 and reaction products 510 (FIGS. 4 and 5) can be assessed by performing a subsequent metal stripping step. The process to strip away unreacted portions of the metal layer 610 from the surface 210 of the substrate 215, including over the source and drain metal silicide contacts 620, can be substantially the same as described for step 117. If the source and drain regions 255 are substantially free of the oxide 410 or reaction products 510, then the metal silicide contacts 620, 630 will not be delaminated from the source and drain regions 255, or from the metal silicide gate electrode 205. Delamination of the metal silicide contacts 620, 630 can be assessed by direct inspection of the device 200 (e.g., transmission electron microscopy), or indirectly by measuring the electrical properties of the device 200. E.g., in some cases, if a current of less than $1\times10^{-9}$, Amps is flowing through the source and drain regions 255, then the metal silicide contacts 620 are considered to have been delaminated by the metal stripping step.

Figure 7:
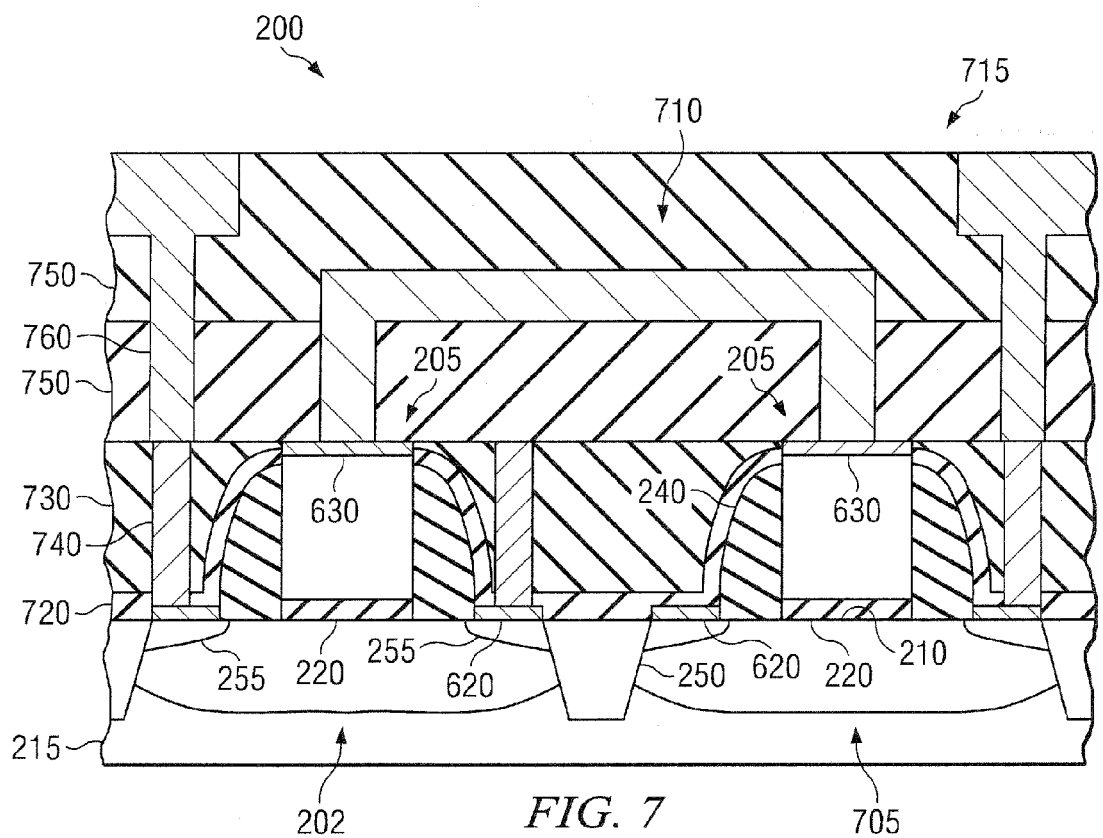

FIG. 7 shows the example device 200 after forming one or more transistors 202, 705 on or in the substrate 215. At least one of the transistors 202 is manufactured by an embodiment of the method discussed above in the context of FIGS. 1-6. In some cases a plurality of transistors are made using the same or alternative embodiments of the method. In some cases at least one of the transistors 202, 705 is a metal oxide semiconductor (MOS) transistor. E.g., one transistor 202 can be an nMOS transistor, while another transistor 705 can be a pMOS transistor, and the transistors 202, 705 can be coupled to each other to form a complementary MOS (CMOS) device 710. In some cases the device 200 includes, or is, an integrated circuit (IC) 715 having the transistor 202, or transistors 202, 705, made according to embodiments of the above-described method.

Numerous additional steps can be performed to complete the manufacture of the transistor 202. E.g., FIG. 7 shows the device after forming a conformal nitride layer 720 on the substrate surface 210, including the transistor 202. FIG. 7 also shows the device after depositing a PMD layer 730 (PMD, silicon dioxide or tetra-ethyl-ortho-silicate) on the nitride layer 720 and after forming metal contacts 740 (e.g., tungsten). The metal contacts 740 are formed through the PMD layer 730 and nitride layer 720 onto the metal silicide gate electrode 205 and the metal silicide source and drain contacts 620. FIG. 7 also shows the device 200 after forming inter-layer dielectric (ILD) layers 750 located over the PMD layer 730 and forming interconnects 760 that are coupled to the metal contacts 740. The transistor 202 is thereby interconnected to other transistors 705 of the IC 715.

FIG. 7 also illustrates another embodiment of the disclosure, an IC 715. The IC 715 comprises a transistor 202 on or in a semiconductor substrate 215. The transistor 202 includes a metal silicide gate electrode 205 on a semiconductor substrate surface 210. The transistor 202 also comprises source and drain regions 255 in semiconductor substrate 215 that are adjacent to the metal silicide gate electrode 205. Transistor 202 further includes metal silicide source and drain contacts 620 on the source and drain regions 255. The semiconductor substrate surface 210, including the source and drain regions 255, are subjected to the cleaning process (step 120), including the dry plasma etch (step 125) and thermal sublimation (step 130), described above in the context of FIGS. 1-6. The cleaning process (step 120) is done prior to forming the metal silicide source and drain contacts 620.

The IC 715 also comprises metal contacts 740 in a PMD layer 730 located over the transistor 202. The contacts 740 are located on the metal silicide gate electrode 205 and the metal silicide source and drain contacts 620. The IC 715 also includes inter-layer dielectric (ILD) layers 750 located over PMD layer 730. Interconnects 760 (e.g., copper or tungsten) are formed through the ILD layers 750 to contact the metal silicide gate electrode 205 and metal silicide source and drain contacts 620 through the metal contacts 740.

In some embodiments, the metal suicide gate electrode 205 and the metal silicide source and drain contacts 620 both comprise a nickel silicide. E.g., to provide the transistor 202 with the desired work function, the metal silicide gate electrode 205 can comprise nickel silicides having a predefined Ni:Si ratio. E.g., the metal silicide gate electrode 205 for one transistor 202 can be composed substantially of $Ni_2Si$, while the metal silicide gate electrode 205 of another transistor 705 can be composed substantially of NiSi (e.g. Ni:Si ratios of 2:1±10 percent and 1:1±10 percent, respectively). The metal silicide source and drain contacts 620 for both transistors 202, 705 can be composed substantially of NiSi. In other embodiments, to increase its conductivity, the metal silicide source and drain contacts 620 further include platinum (e.g., Ni:Si:Pt ratios of about 49:49:5).

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:

forming a metal silicide gate electrode on a semiconductor substrate surface while a sacrificial layer covers source and drain regions of said semiconductor device;

removing said sacrificial layer, wherein an oxide layer is formed on said metal silicide gate electrode and said source and drains regions as a byproduct of said removing;

exposing said metal silicide gate electrode and said substrate surface to a cleaning process to remove said oxide layer, including:

a dry plasma etch using an anhydrous fluoride-containing feed gas; and a thermal sublimation configured to leave said metal silicide gate electrode substantially unaltered;

depositing a metal layer on source and drain regions of said substrate surface; and annealing said metal layer and said source and drain regions of said substrate surface to form metal silicide source and drain contacts;

said feed gas further including a sublimable base in the form of an anion that is complexed with at least one reaction product of the dry plasma etch, and then sublimed in the thermal sublimation prior to depositing the metal layer on the source and drain regions;

wherein said feed gas further includes a sublimable base of pyridine or a mixture of ammonia and pyridine.

2. The method of claim 1, wherein said cleaning process consists essentially of said dry plasma etch and said thermal sublimation.

3. The method of claim 1, wherein said anhydrous fluoride-containing feed gas includes hydrogen fluoride, ammonium fluoride, nitrogen trifluoride or mixtures thereof and less than about 0.1 wt percent water content.

4. The method of claim 1, wherein said thermal sublimation includes a flow of $H_2$:Ar in sccm ratios of 1000:1000 at a pressure of less than about 760 Torr.

5. The method of claim 1, wherein a duration of said thermal sublimation ranges from about 30 to 90 seconds.

6. The method of claim 1, wherein said forming said metal silicide gate electrode includes:

depositing a gate dielectric layer on said semiconductor surface;

depositing a silicon-containing gate electrode layer on said gate dielectric layer;

depositing a metal layer on said silicon-containing gate electrode layer; and annealing said metal layer and said silicon-containing gate electrode layer to form a metal silicide alloy.

* * * * *